United States Patent
Lee et al.

(10) Patent No.: US 10,998,875 B1
(45) Date of Patent: May 4, 2021

(54) CABLE TELEVISION APPARATUS IMPROVING HIGH FREQUENCY CHARACTERISTICS

(71) Applicant: CABLE VISION ELECTRONICS CO., LTD, New Taipei (TW)

(72) Inventors: Chien-Chung Lee, New Taipei (TW); I-Sheng Ting, New Taipei (TW)

(73) Assignee: CABLE VISION ELECTRONICS CO., LTD, New Taipei (TW)

( * ) Notice: Subject to any disclaimer, the term of this patent is extended or adjusted under 35 U.S.C. 154(b) by 0 days.

(21) Appl. No.: 16/867,481

(22) Filed: May 5, 2020

(30) Foreign Application Priority Data

Feb. 27, 2020 (TW) .................................. 109202187

(51) Int. Cl.
| | | |
|---|---|---|
| *H04N 7/10* | (2006.01) | |
| *H03H 7/01* | (2006.01) | |
| *H01R 24/50* | (2011.01) | |
| *H04N 5/38* | (2006.01) | |
| *H01R 103/00* | (2006.01) | |

(52) U.S. Cl.
CPC ........... *H03H 7/0123* (2013.01); *H01R 24/50* (2013.01); *H03H 7/0138* (2013.01); *H04N 5/38* (2013.01); *H04N 7/102* (2013.01); *H01R 2103/00* (2013.01)

(58) Field of Classification Search
CPC ...... H03H 7/0123; H03H 7/0138; H04N 5/38; H04N 7/102; H01R 24/50; H01R 2103/00
USPC ........................................................ 348/723
See application file for complete search history.

(56) References Cited

U.S. PATENT DOCUMENTS

| | | | | |
|---|---|---|---|---|
| 6,054,905 A | * | 4/2000 | Gresko | H04N 7/102 333/100 |
| 6,703,910 B1 | * | 3/2004 | Lapushin | H01F 17/045 333/181 |
| 2003/0223160 A1 | * | 12/2003 | Pixley | H04B 3/54 361/42 |
| 2005/0047051 A1 | * | 3/2005 | Marland | H02H 9/005 361/119 |
| 2010/0323560 A1 | * | 12/2010 | Yin | H01R 24/58 439/668 |
| 2011/0095848 A1 | * | 4/2011 | Dounaevski | H03H 7/46 333/181 |
| 2012/0208406 A1 | * | 8/2012 | Lin | H01R 13/2421 439/700 |

(Continued)

FOREIGN PATENT DOCUMENTS

JP 06326636 A * 11/1994

*Primary Examiner* — Michael Lee
(74) *Attorney, Agent, or Firm* — Chun-Ming Shih; HDLS IPR Services

(57) ABSTRACT

A cable television apparatus improving high frequency characteristics includes a first connector and a first choke. The first connector is electrically connected to an input coaxial cable or an output coaxial cable. The first choke is electrically connected to the first connector. The first connector includes a first signal transmission unit. The first choke is used to block a cable television signal. The first choke allows a first current flowing through the first choke. The first current is greater than or equal to 10 amperes. The first choke is directly touched the first signal transmission unit, or a connection path length between the first signal transmission unit and a pin of the first choke is less than 5 millimeters.

8 Claims, 10 Drawing Sheets

(56) References Cited

U.S. PATENT DOCUMENTS

| | | | |
|---|---|---|---|
| 2015/0050844 A1* | 2/2015 | Ju ........................ | H01R 12/722 |
| | | | 439/682 |
| 2015/0263696 A1* | 9/2015 | Dounaevski ......... | H03H 7/0115 |
| | | | 333/132 |

* cited by examiner

CABLE TELEVISION APPARATUS IMPROVING HIGH FREQUENCY CHARACTERISTICS

BACKGROUND OF THE INVENTION

Field of the Invention

The present invention relates to a cable television apparatus, and especially relates to a cable television apparatus improving high frequency characteristics.

Description of the Related Art

Currently, the cable television system is very popular. The cable television system transmits television programs and network signals to client sides through coaxial cables.

However, the connection of the connector inside the cable television apparatus and the choke inside the cable television apparatus affects the high frequency characteristics of the cable television apparatus, so that the cable television system dealer cannot extend the bandwidth to provide more services. Currently, the cable television system dealer needs more simple method for improving the high frequency characteristics to increase the available bandwidth to provide more services.

SUMMARY OF THE INVENTION

In order to solve the above-mentioned problems, an object of the present invention is to provide a cable television apparatus improving high frequency characteristics.

In order to achieve the object of the present invention mentioned above, the cable television apparatus of the present invention is applied to an input coaxial cable and an output coaxial cable to transmit a cable television signal. The cable television apparatus comprises a first connector and a first choke. The first connector is electrically connected to the input coaxial cable or the output coaxial cable. The first choke is electrically connected to the first connector. Moreover, the first connector comprises a first signal transmission unit. Moreover, the first choke is used to block the cable television signal. The first choke is directly touched the first signal transmission unit. The first choke allows a first current flowing through the first choke. The first current is greater than or equal to 10 amperes.

Moreover, in an embodiment of the cable television apparatus of the present invention mentioned above, the first choke is directly soldered to the first signal transmission unit.

Moreover, in an embodiment of the cable television apparatus of the present invention mentioned above, the first signal transmission unit defines a soldering hole. A pin of the first choke inserts into the soldering hole to be soldered to the first signal transmission unit.

Moreover, in an embodiment of the cable television apparatus of the present invention mentioned above, the first signal transmission unit comprises a first signal transmission body and a second signal transmission body. The second signal transmission body is electrically connected to the first signal transmission body and the first choke. Moreover, the first signal transmission body and the second signal transmission body are connected perpendicularly. The second signal transmission body defines a soldering hole. A pin of the first choke inserts into the soldering hole to be soldered to the second signal transmission body.

Moreover, in an embodiment of the cable television apparatus of the present invention mentioned above, the cable television apparatus further comprises a first capacitor, a second connector, a second choke, a second capacitor, a third capacitor, a first pluggable conduction component, a second pluggable conduction component, a fifth capacitor, a fourth capacitor, a sixth capacitor, a third choke, a seventh capacitor and a third connector. The first capacitor is electrically connected to the first connector and the first choke. The second connector is electrically connected to the first capacitor. The second choke is electrically connected to the second connector and the first capacitor. The second capacitor is electrically connected to the first choke. The third capacitor is electrically connected to the second capacitor. The first pluggable conduction component is electrically connected to the first choke and the second capacitor. The second pluggable conduction component is electrically connected to the second choke and the first pluggable conduction component. The fifth capacitor is electrically connected to the second choke and the second pluggable conduction component. The fourth capacitor is electrically connected to the fifth capacitor. The sixth capacitor is electrically connected to the second pluggable conduction component and the first pluggable conduction component. The third choke is electrically connected to the second pluggable conduction component, the first pluggable conduction component and the sixth capacitor. The seventh capacitor is electrically connected to the third choke. The third connector is electrically connected to the third choke and the seventh capacitor. Moreover, the second choke is used to block the cable television signal. The first pluggable conduction component is a pluggable jumper or a fuse. The second pluggable conduction component is a pluggable jumper or a fuse. The second choke allows a second current flowing through the second choke. The second current is greater than or equal to 10 amperes. The third choke allows a third current flowing through the third choke. The third current is greater than or equal to 10 amperes. The second connector comprises a second signal transmission unit. The second choke is directly touched the second signal transmission unit.

Moreover, in an embodiment of the cable television apparatus of the present invention mentioned above, the cable television apparatus further comprises an input capacitor, a directional coupler, an output capacitor, a second connector, a second choke and a distribution circuit. The input capacitor is electrically connected to the first connector and the first choke. The directional coupler is electrically connected to the input capacitor. The output capacitor is electrically connected to the directional coupler. The second connector is electrically connected to the output capacitor. The second choke is electrically connected to the second connector, the output capacitor and the first choke. The distribution circuit is electrically connected to the directional coupler. Moreover, the second choke is used to block the cable television signal. The second choke allows a second current flowing through the second choke. The second current is greater than or equal to 10 amperes. The second connector comprises a second signal transmission unit. The second choke is directly touched the second signal transmission unit.

Moreover, in an embodiment of the cable television apparatus of the present invention mentioned above, a length of a pin of the first choke directly touched the first signal transmission unit is less than 1 millimeter.

A cable television apparatus improving high frequency characteristics is applied to an input coaxial cable and an output coaxial cable to transmit a cable television signal.

The cable television apparatus comprises a first connector and a first choke. The first connector is electrically connected to the input coaxial cable or the output coaxial cable. The first choke is electrically connected to the first connector. Moreover, the first connector comprises a first signal transmission unit. Moreover, the first choke is used to block the cable television signal. A connection path length between the first signal transmission unit and a pin of the first choke is less than 5 millimeters. The first choke allows a first current flowing through the first choke. The first current is greater than or equal to 10 amperes.

Moreover, in an embodiment of the cable television apparatus of the present invention mentioned above, the cable television apparatus further comprises a first capacitor, a second connector, a second choke, a second capacitor, a third capacitor, a first pluggable conduction component, a second pluggable conduction component, a fifth capacitor, a fourth capacitor, a sixth capacitor, a third choke, a seventh capacitor and a third connector. The first capacitor is electrically connected to the first connector and the first choke. The second connector is electrically connected to the first capacitor. The second choke is electrically connected to the second connector and the first capacitor. The second capacitor is electrically connected to the first choke. The third capacitor is electrically connected to the second capacitor. The first pluggable conduction component is electrically connected to the first choke and the second capacitor. The second pluggable conduction component is electrically connected to the second choke and the first pluggable conduction component. The fifth capacitor is electrically connected to the second choke and the second pluggable conduction component. The fourth capacitor is electrically connected to the fifth capacitor. The sixth capacitor is electrically connected to the second pluggable conduction component and the first pluggable conduction component. The third choke is electrically connected to the second pluggable conduction component, the first pluggable conduction component and the sixth capacitor. The seventh capacitor is electrically connected to the third choke. The third connector is electrically connected to the third choke and the seventh capacitor. Moreover, the second choke is used to block the cable television signal. The first pluggable conduction component is a pluggable jumper or a fuse. The second pluggable conduction component is a pluggable jumper or a fuse. The second choke allows a second current flowing through the second choke. The second current is greater than or equal to 10 amperes. The third choke allows a third current flowing through the third choke. The third current is greater than or equal to 10 amperes. The second connector comprises a second signal transmission unit. A connection path length between the second signal transmission unit and the second choke is less than 5 millimeters.

Moreover, in an embodiment of the cable television apparatus of the present invention mentioned above, the cable television apparatus further comprises an input capacitor, a directional coupler, an output capacitor, a second connector, a second choke and a distribution circuit. The input capacitor is electrically connected to the first connector and the first choke. The directional coupler is electrically connected to the input capacitor. The output capacitor is electrically connected to the directional coupler. The second connector is electrically connected to the output capacitor. The second choke is electrically connected to the second connector, the output capacitor and the first choke. The distribution circuit is electrically connected to the directional coupler. Moreover, the second choke is used to block the cable television signal. The second choke allows a second current flowing through the second choke. The second current is greater than or equal to 10 amperes. The second connector comprises a second signal transmission unit. A connection path length between the second signal transmission unit and the second choke is less than 5 millimeters.

Moreover, in an embodiment of the cable television apparatus of the present invention mentioned above, a length of the pin of the first choke is less than 1 millimeter.

The advantage of the present invention is to improve the high frequency characteristics of the cable television apparatus.

Please refer to the detailed descriptions and figures of the present invention mentioned below for further understanding the technology, method and effect of the present invention achieving the predetermined purposes. It believes that the purposes, characteristic and features of the present invention can be understood deeply and specifically. However, the figures are only for references and descriptions, but the present invention is not limited by the figures.

DETAILED DESCRIPTION OF THE INVENTION

Figure 9:
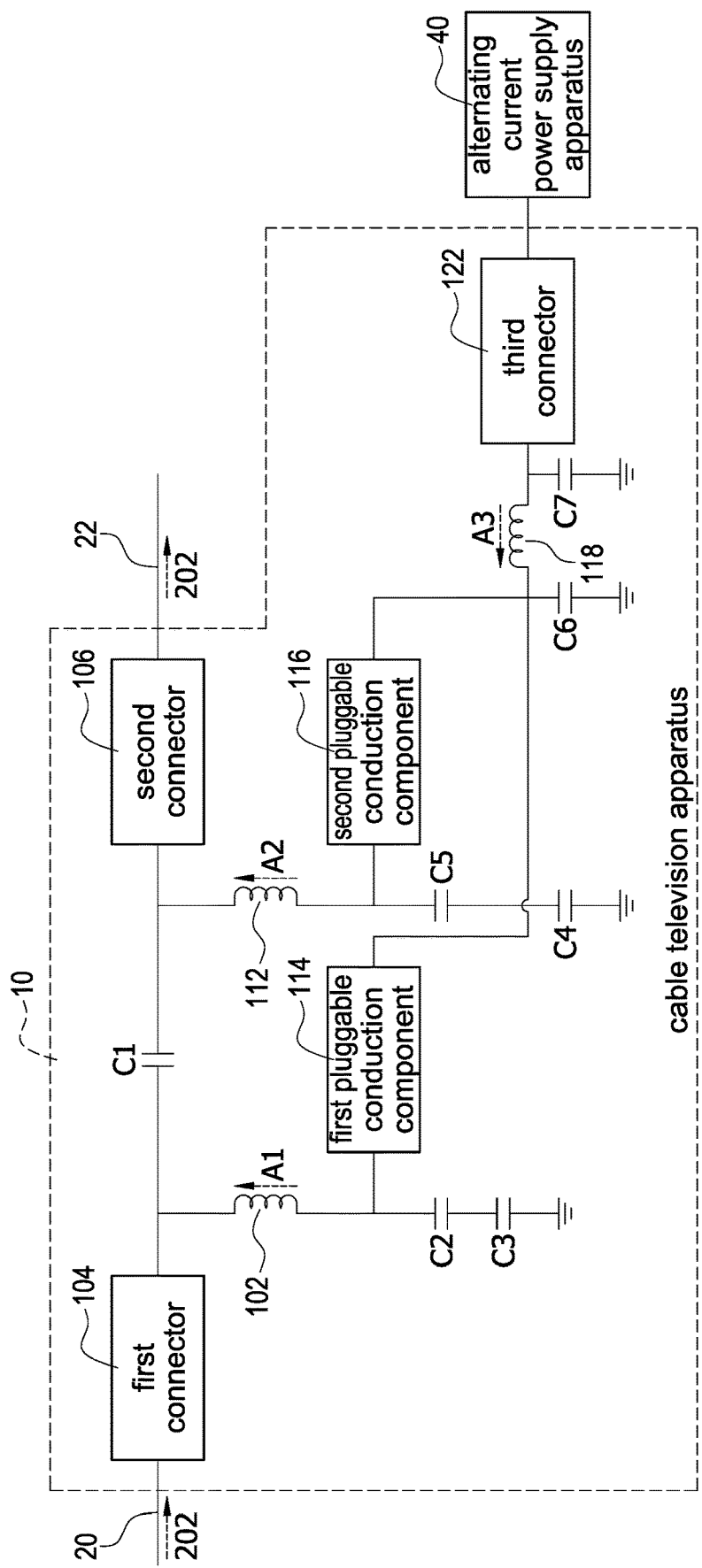
FIG. 9 shows a block circuit diagram of an application embodiment of the cable television apparatus of the present invention.

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 9 shows a block circuit diagram of an application embodiment of the cable television apparatus of the present invention. A cable television apparatus 10 improving high frequency characteristics of the present invention is applied to an alternating current power supply apparatus 40, an input coaxial cable 20 and an output coaxial cable 22 to transmit a cable television signal 202. The cable television apparatus 10 comprises a first connector 104, a first choke 102, a second connector 106, a second choke 112, a first capacitor C1, a second capacitor C2, a third capacitor C3, a first pluggable conduction component 114, a second pluggable conduction component 116, a fifth capacitor C5, a fourth capacitor C4, a sixth capacitor C6, a third choke 118, a seventh capacitor C7 and a third connector 122. The components mentioned above are electrically connected to each other. The embodiment of FIG. 9 can be also called a power inserter.

The first choke 102 is used to block the cable television signal 202. The second choke 112 is used to block the cable television signal 202. The first pluggable conduction component 114 is a pluggable jumper or a fuse. The second pluggable conduction component 116 is a pluggable jumper or a fuse. The first choke 102 allows a first current A1 flowing through the first choke 102. The first current A1 is greater than or equal to 10 amperes. The second choke 112 allows a second current A2 flowing through the second choke 112. The second current A2 is greater than or equal to 10 amperes. The third choke 118 allows a third current A3 flowing through the third choke 118. The third current A3 is greater than or equal to 10 amperes.

Figure 10:
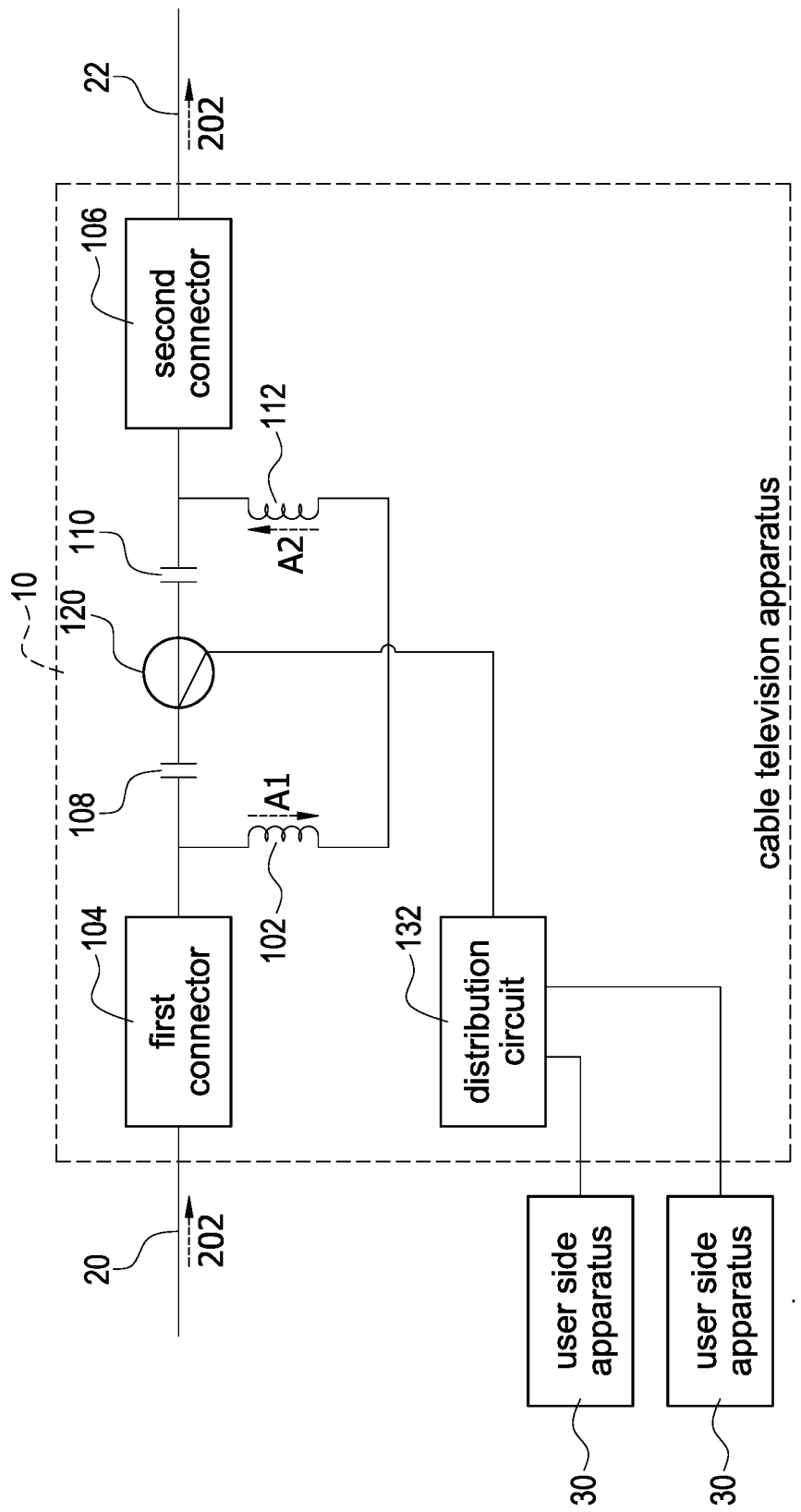
FIG. 10 shows a block circuit diagram of another application embodiment of the cable television apparatus of the present invention.

FIG. 10 shows a block circuit diagram of another application embodiment of the cable television apparatus of the present invention. A cable television apparatus 10 improving high frequency characteristics of the present invention is applied to a plurality of user side apparatuses 30, an input coaxial cable 20 and an output coaxial cable 22 to transmit a cable television signal 202. The cable television apparatus 10 comprises a first connector 104, a first choke 102, a second connector 106, a second choke 112, an input capacitor 108, a directional coupler 120, an output capacitor 110 and a distribution circuit 132. The components mentioned above are electrically connected to each other.

The first choke 102 is used to block the cable television signal 202. The second choke 112 is used to block the cable television signal 202. The first choke 102 allows a first current A1 flowing through the first choke 102. The first current A1 is greater than or equal to 10 amperes. The second choke 112 allows a second current A2 flowing through the second choke 112. The second current A2 is greater than or equal to 10 amperes.

Figure 1:
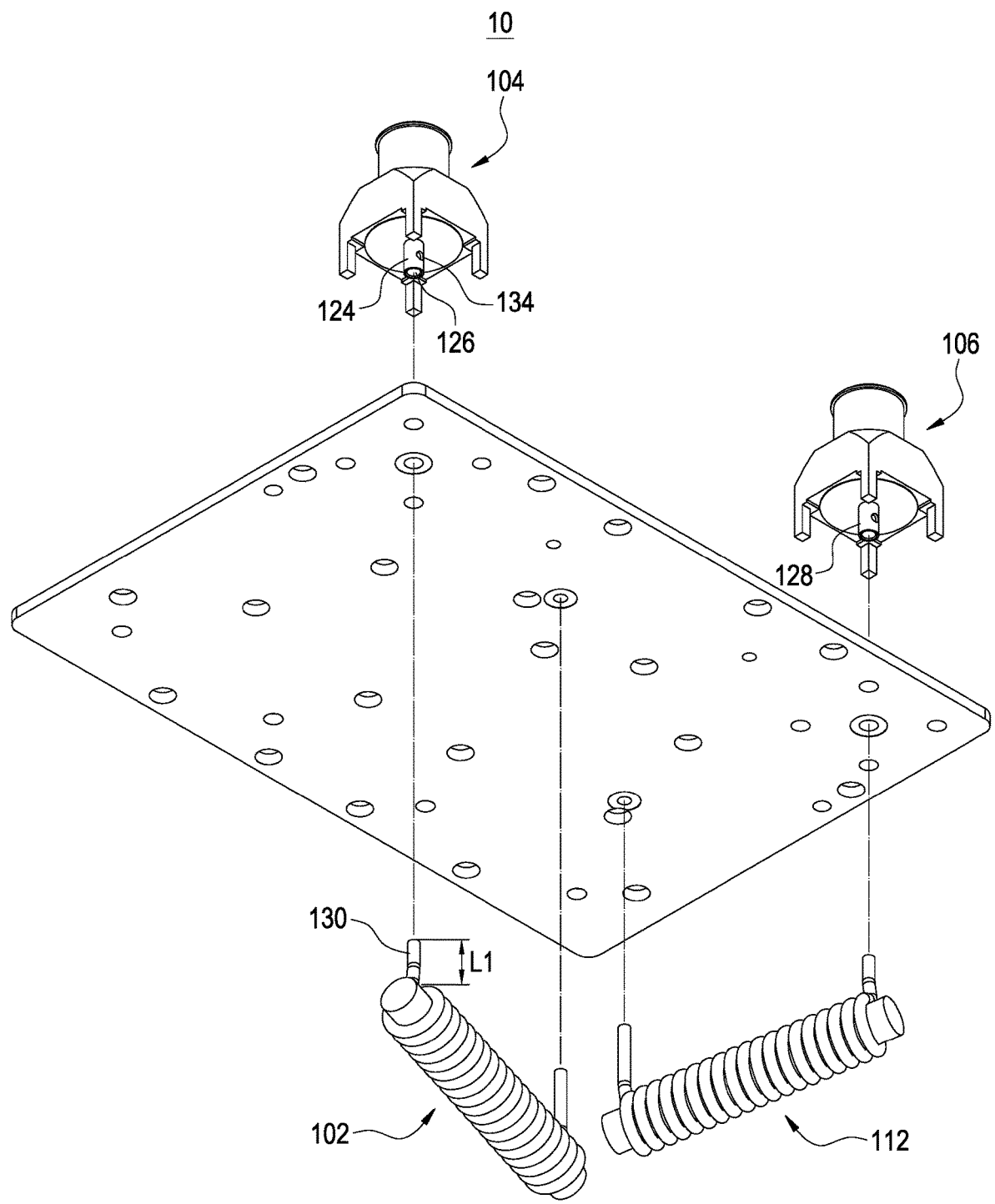
FIG. 1 shows an exploded view of the first embodiment of the cable television apparatus of the present invention.
Figure 2:
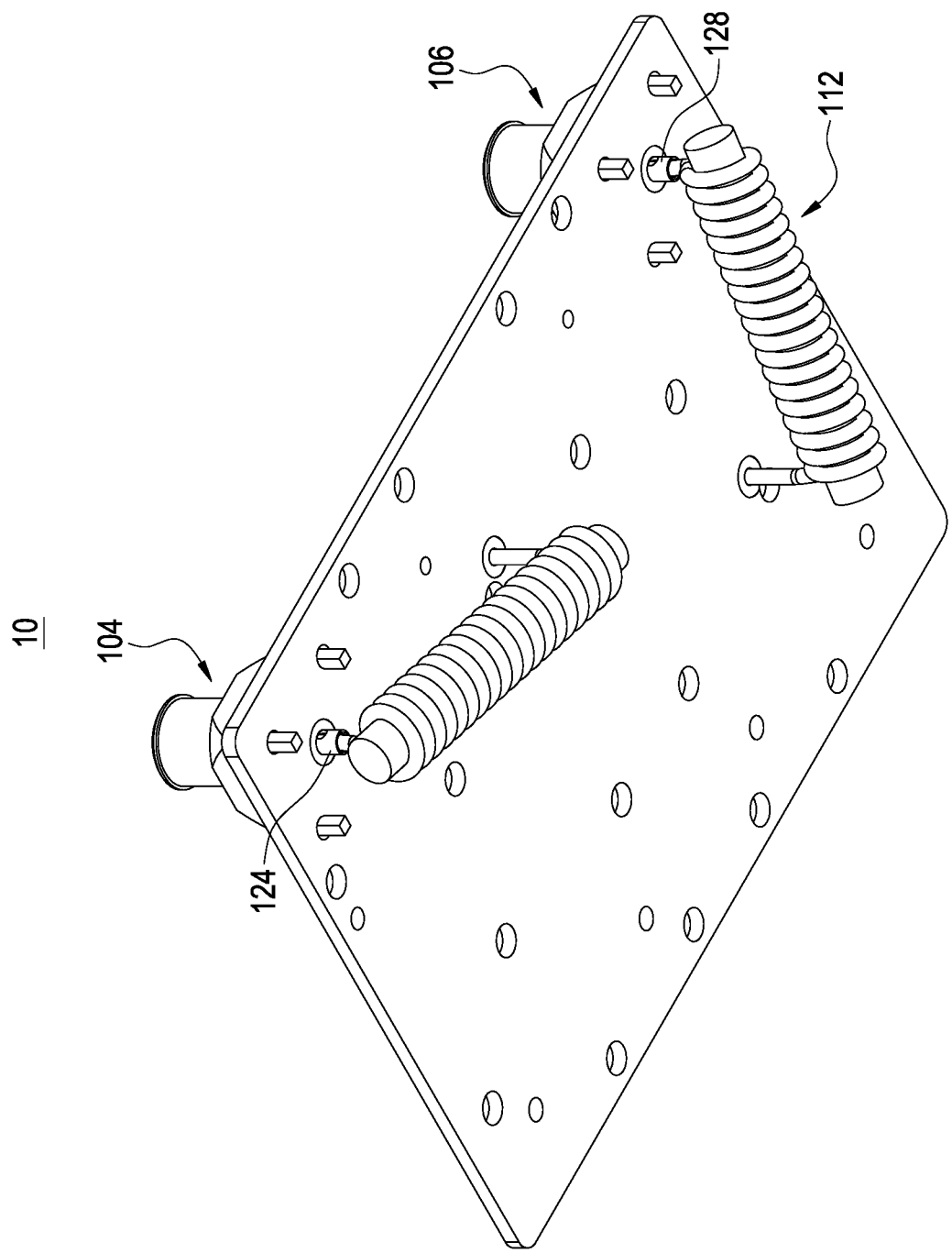
FIG. 2 shows an assembly drawing of the first embodiment of the cable television apparatus of the present invention.
Figure 3:
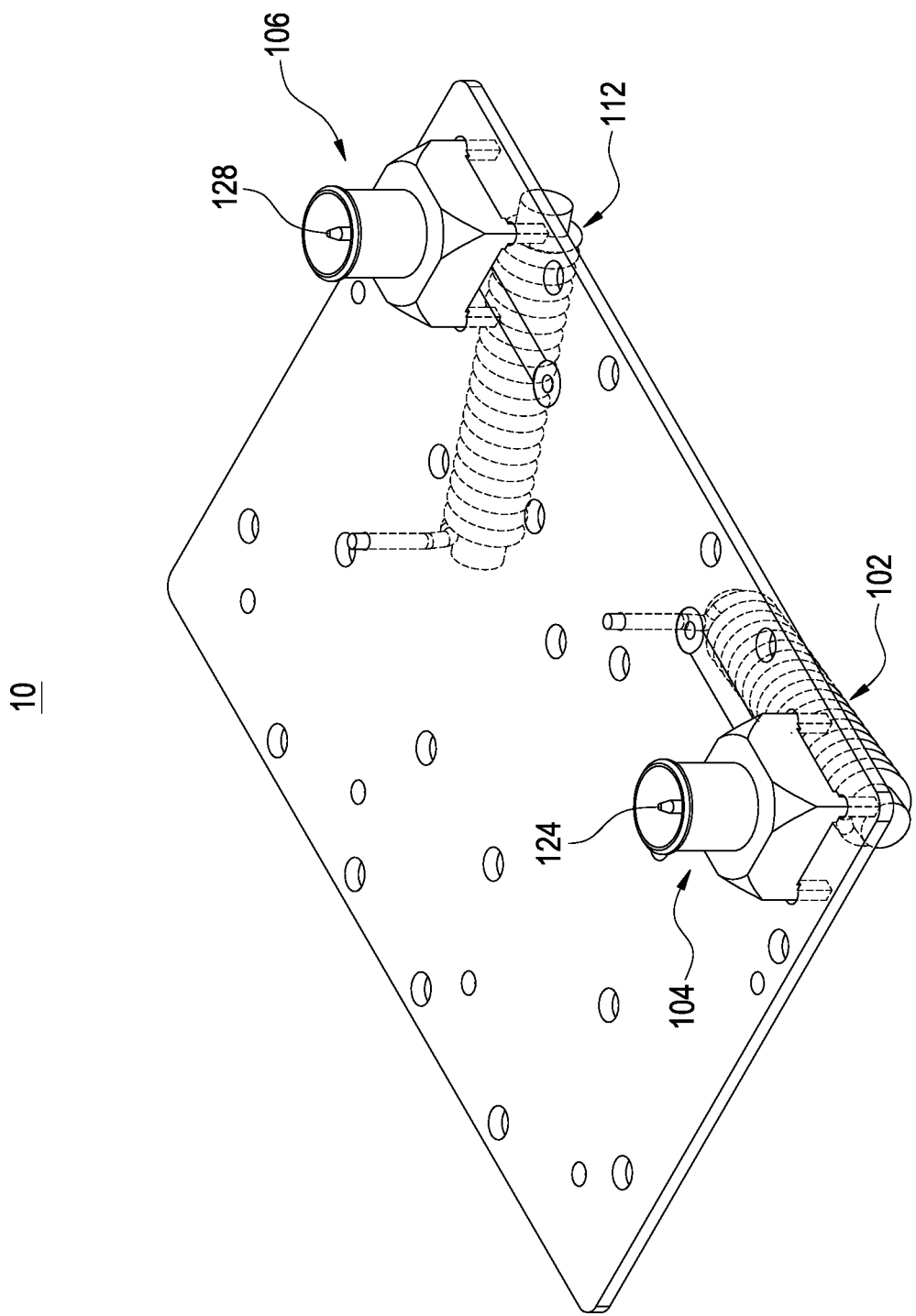
FIG. 3 shows an upper perspective drawing of the first embodiment of the cable television apparatus of the present invention.
Figure 4:
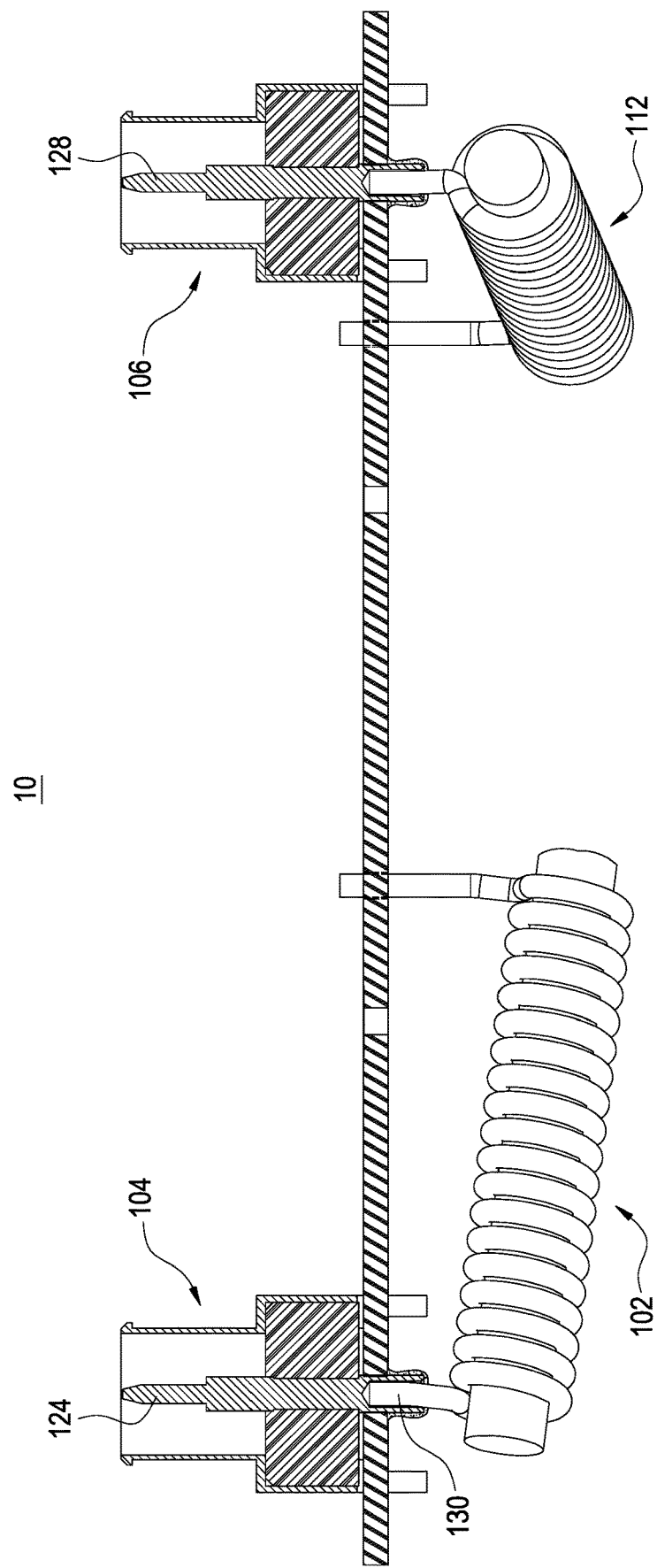
FIG. 4 shows a side perspective drawing (1) of the first embodiment of the cable television apparatus of the present invention.
Figure 5:
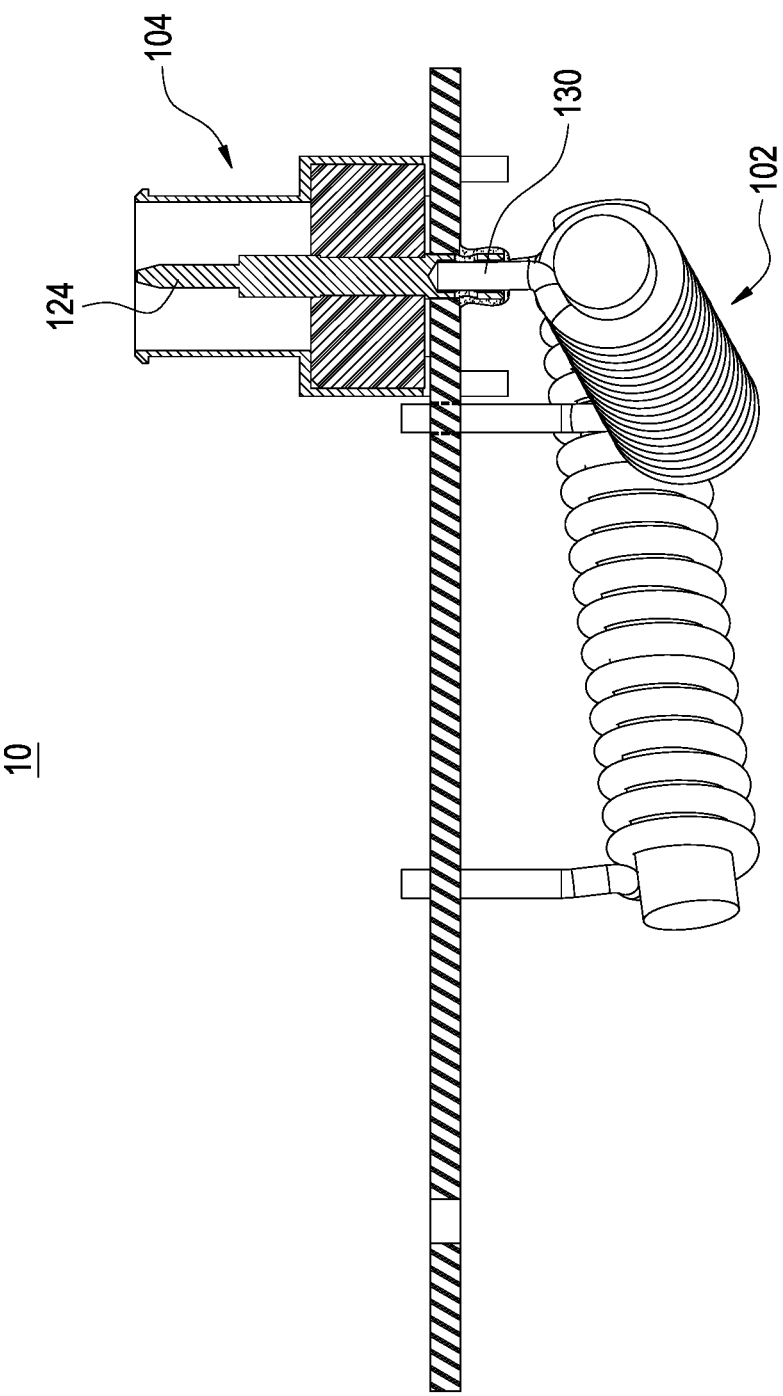
FIG. 5 shows a side perspective drawing (2) of the first embodiment of the cable television apparatus of the present invention.

FIG. 1 shows an exploded view of the first embodiment of the cable television apparatus of the present invention. FIG. 2 shows an assembly drawing of the first embodiment of the cable television apparatus of the present invention. FIG. 3 shows an upper perspective drawing of the first embodiment of the cable television apparatus of the present invention. FIG. 4 shows a side perspective drawing (1) of the first embodiment of the cable television apparatus of the present invention. FIG. 5 shows a side perspective drawing (2) of the first embodiment of the cable television apparatus of the present invention. The descriptions of the elements shown in FIG. 1 to FIG. 5 which are the same as the elements shown in FIG. 9 to FIG. 10 are not repeated here for brevity.

The first connector 104 comprises a first signal transmission unit 124. The first choke 102 is directly touched the first signal transmission unit 124. The second connector 106 comprises a second signal transmission unit 128. The second choke 112 is directly touched the second signal transmission unit 128. The first signal transmission unit 124 defines a soldering hole 126. A pin 130 of the first choke 102 inserts into the soldering hole 126 to be soldered to the first signal transmission unit 124. Moreover, the first signal transmission unit 124 further defines a soldering ventilation hole 134.

Figure 6:
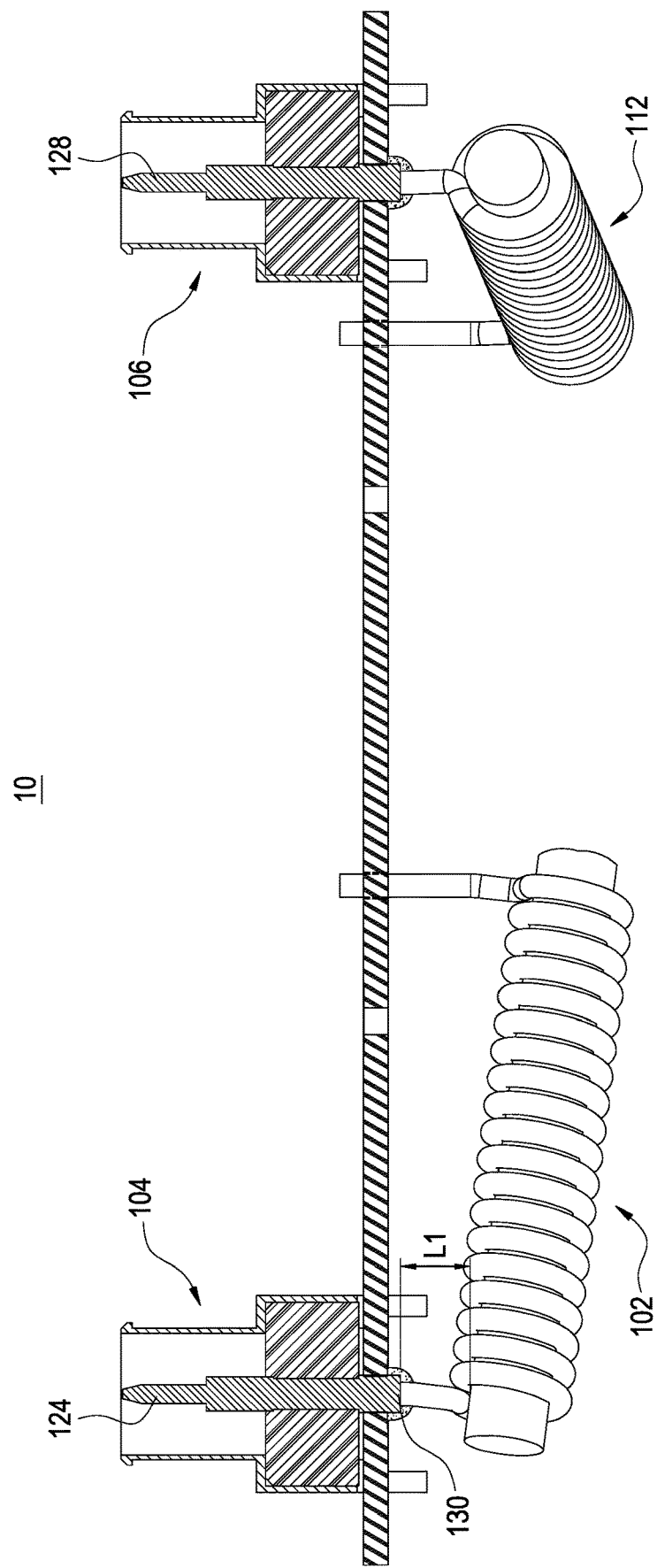
FIG. 6 shows a side perspective drawing of the second embodiment of the cable television apparatus of the present invention.

FIG. 6 shows a side perspective drawing of the second embodiment of the cable television apparatus of the present invention. The descriptions of the elements shown in FIG. 6 which are the same as the elements shown in FIG. 1 to FIG. 5 and FIG. 9 to FIG. 10 are not repeated here for brevity. The first choke 102 is directly soldered to the first signal transmission unit 124. A length L1 of a pin 130 of the first choke 102 directly touched the first signal transmission unit 124 is less than 1 millimeter.

Figure 7:
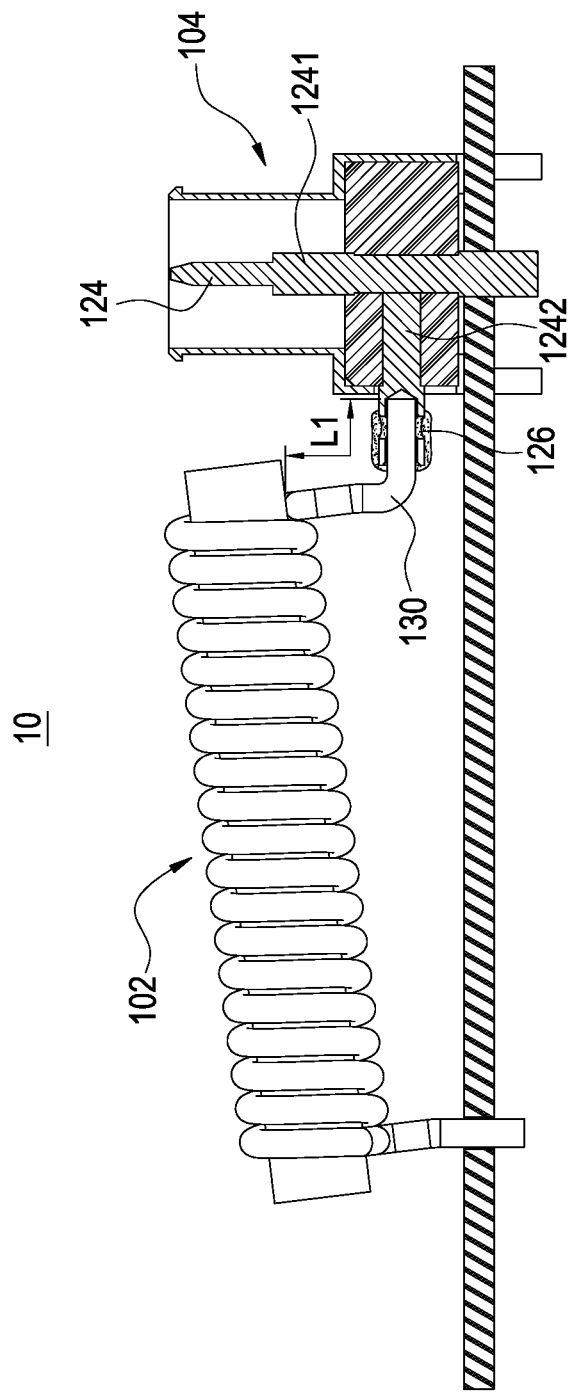
FIG. 7 shows a side perspective drawing of the third embodiment of the cable television apparatus of the present invention.

FIG. 7 shows a side perspective drawing of the third embodiment of the cable television apparatus of the present invention. The descriptions of the elements shown in FIG. 7 which are the same as the elements shown in FIG. 1 to FIG. 6 and FIG. 9 to FIG. 10 are not repeated here for brevity. The first signal transmission unit 124 comprises a first signal transmission body 1241 and a second signal transmission body 1242. The second signal transmission body 1242 is electrically connected to the first signal transmission body 1241 and the first choke 102. The first signal transmission body 1241 and the second signal transmission body 1242 are connected perpendicularly. The second signal transmission body 1242 defines a soldering hole 126. A pin 130 of the first choke 102 inserts into the soldering hole 126 to be soldered to the second signal transmission body 1242.

Figure 8:
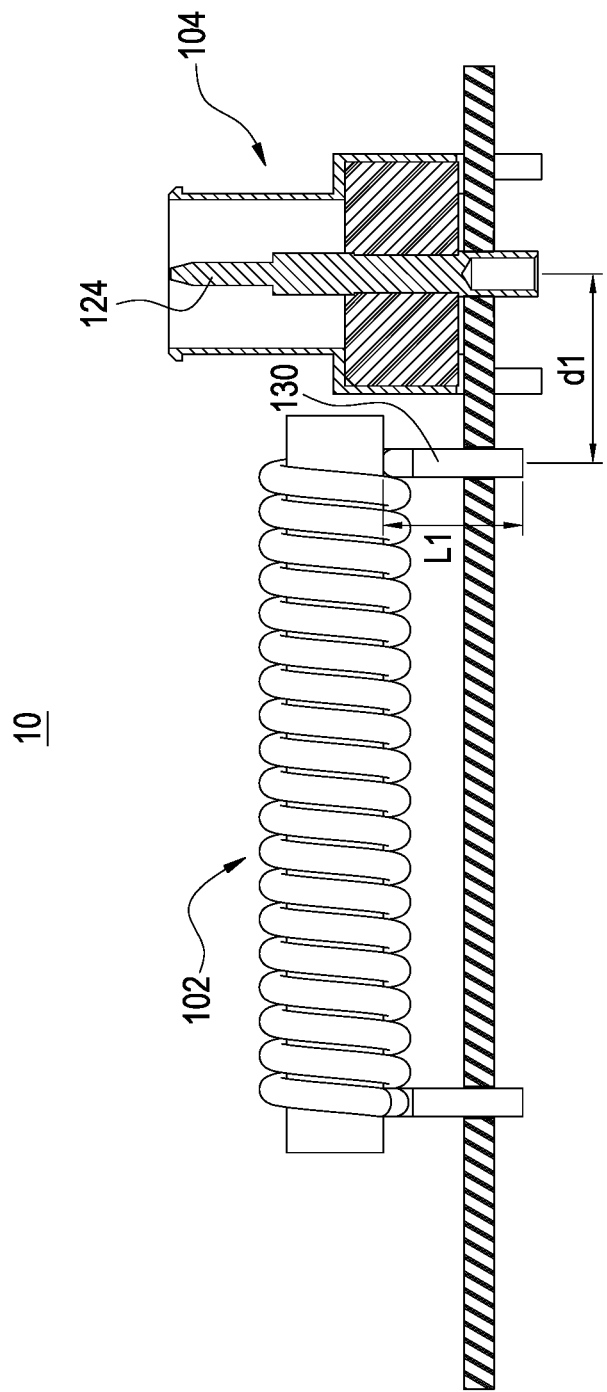
FIG. 8 shows a side perspective drawing of the fourth embodiment of the cable television apparatus of the present invention.

FIG. 8 shows a side perspective drawing of the fourth embodiment of the cable television apparatus of the present invention. The descriptions of the elements shown in FIG. 8 which are the same as the elements shown in FIG. 1 to FIG. 7 and FIG. 9 to FIG. 10 are not repeated here for brevity. A connection path length dl between the first signal transmission unit 124 and a pin 130 of the first choke 102 is less than 5 millimeters. A length L1 of the pin 130 of the first choke 102 is less than 1 millimeter. Although FIG. 8 does not show the second signal transmission unit 128 and the second choke 112, the second signal transmission unit 128 and the second choke 112 are similar with the first signal transmission unit 124 and the first choke 102, so that a connection path length between the second signal transmission unit 128 and the second choke 112 is less than 5 millimeters.

Because the second connector 106 is similar with the first connector 104, and because the second choke 112 is similar with the first choke 102, all technical contents of the first connector 104 and the first choke 102 mentioned in FIG. 1 to FIG. 8 mentioned above can be also applied to the second connector 106 and the second choke 112 at the same time.

The advantage of the present invention is to improve the high frequency characteristics of the cable television apparatus.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A cable television apparatus improving high frequency characteristics applied to an input coaxial cable and an output coaxial cable to transmit a cable television signal, the cable television apparatus comprising:

a first connector electrically connected to the input coaxial cable or the output coaxial cable;
a first choke electrically connected to the first connector;
a first capacitor electrically connected to the first connector and the first choke;
a second connector electrically connected to the first capacitor;
a second choke electrically connected to the second connector and the first capacitor;
a second capacitor electrically connected to the first choke;
a third capacitor electrically connected to the second capacitor;
a first pluggable conduction component electrically connected to the first choke and the second capacitor;
a second pluggable conduction component electrically connected to the second choke and the first pluggable conduction component;
a fifth capacitor electrically connected to the second choke and the second pluggable conduction component;
a fourth capacitor electrically connected to the fifth capacitor;
a sixth capacitor electrically connected to the second pluggable conduction component and the first pluggable conduction component;
a third choke electrically connected to the second pluggable conduction component, the first pluggable conduction component and the sixth capacitor;
a seventh capacitor electrically connected to the third choke; and
a third connector electrically connected to the third choke and the seventh capacitor,
wherein the first connector comprises:
a first signal transmission unit,
wherein the first choke is used to block the cable television signal; the first choke is directly touched the first signal transmission unit; the first choke allows a first current flowing through the first choke; the first current is greater than or equal to 10 amperes; the second choke is used to block the cable television signal; the first pluggable conduction component is a pluggable jumper or a fuse; the second pluggable conduction component is a pluggable jumper or a fuse; the second choke allows a second current flowing through the second choke; the second current is greater than or equal to 10 amperes; the third choke allows a third current flowing through the third choke; the third current is greater than or equal to 10 amperes; the second connector comprises a second signal transmission unit; the second choke is directly touched the second signal transmission unit.

2. The cable television apparatus of claim 1, wherein the first choke is directly soldered to the first signal transmission unit.

3. The cable television apparatus of claim 1, wherein the first signal transmission unit defines a soldering hole; a pin of the first choke inserts into the soldering hole to be soldered to the first signal transmission unit.

4. The cable television apparatus of claim 1, wherein the first signal transmission unit comprises:
a first signal transmission body; and
a second signal transmission body electrically connected to the first signal transmission body and the first choke,
wherein the first signal transmission body and the second signal transmission body ae connected perpendicularly;
the second signal transmission body defines a soldering hole; a pin of the first choke inserts into the soldering hole to be soldered to the second signal transmission body.

5. The cable television apparatus of claim 1, wherein a length of a pin of the first choke directly touched the first signal transmission unit is less than 1 millimeter.

6. A cable television apparatus improving high frequency characteristics applied to an input coaxial cable and an output coaxial cable to transmit a cable television signal, the cable television apparatus comprising:
a first connector electrically connected to the input coaxial cable or the output coaxial cable; and
a first choke electrically connected to the first connector,
a first capacitor electrically connected to the first connector and the first choke;
a second connector electrically connected to the first capacitor;
a second choke electrically connected to the second connector and the first capacitor;
a second capacitor electrically connected to the first choke;
a third capacitor electrically connected to the second capacitor;
a first pluggable conduction component electrically connected to the first choke and the second capacitor;
a second pluggable conduction component electrically connected to the second choke and the first pluggable conduction component;
a fifth capacitor electrically connected to the second choke and the second pluggable conduction component;
a fourth capacitor electrically connected to the fifth capacitor;
a sixth capacitor electrically connected to the second pluggable conduction component and the first pluggable conduction component;
a third choke electrically connected to the second pluggable conduction component, the first pluggable conduction component and the sixth capacitor;
a seventh capacitor electrically connected to the third choke; and
a third connector electrically connected to the third choke and the seventh capacitor,
wherein the first connector comprises:
a first signal transmission unit,
wherein the first choke is used to block the cable television signal; a connection path length between the first signal transmission unit and a pin of the first choke is less than 5 millimeters; the first choke allows a first current flowing through the first choke; the first current is greater than or equal to 10 amperes; the second choke is used to block the cable television signal; the first pluggable conduction component is a pluggable jumper or a fuse; the second pluggable conduction component is a pluggable jumper or a fuse; the second choke allows a second current flowing through the second choke; the second current is greater than or equal to 10 amperes; the third choke allows a third current flowing through the third choke; the third current is greater than or equal to 10 amperes; the second connector comprises a second signal transmission unit; a connection path length between the second signal transmission unit and the second choke is less than 5 millimeters.

7. The cable television apparatus improving high frequency characteristics applied to an input coaxial cable and an output coaxial cable to transmit a cable television signal, the cable television apparatus comprising:
- a first connector electrically connected to the input coaxial cable or the output coaxial cable;
- a first choke electrically connected to the first connector;
- an input capacitor electrically connected to the first connector and the first choke;
- a directional coupler electrically connected to the input capacitor;
- an output capacitor electrically connected to the directional coupler;
- a second connector electrically connected to the output capacitor;
- a second choke electrically connected to the second connector, the output capacitor and the first choke; and
- a distribution circuit electrically connected to the directional coupler, wherein the first connector comprises:
a first signal transmission unit,
wherein the first choke is used to block the cable television signal; a connection path length between the first signal transmission unit and a pin of the first choke is less than 5 millimeters; the first choke allows a first current flowing through the first choke; the first current is greater than or equal to 10 amperes; the second choke is used to block the cable television signal; the second choke allows a second current flowing through the second choke; the second current is greater than or equal to 10 amperes; the second connector comprises a second signal transmission unit; a connection path length between the second signal transmission unit and the second choke is less than 5 millimeters.

8. The cable television apparatus of claim 6, wherein a length of the pin of the first choke is less than 1 millimeter.

* * * * *